(12) United States Patent
Guo et al.

(10) Patent No.: US 10,110,312 B2
(45) Date of Patent: Oct. 23, 2018

(54) VISIBLE LIGHT COMMUNICATION EMISSION DEVICE WITH IMPROVED RESPONSE FREQUENCY

(71) Applicant: South China Normal University, Guangzhou, Guangdong (CN)

(72) Inventors: Zhiyou Guo, Guangdong (CN); Jie Sun, Guangdong (CN); Jing Huang, Guangdong (CN); Huiqing Shun, Guangdong (CN); Hongyong Huang, Guangdong (CN); Yong Huang, Guangdong (CN); Xian Yang, Guangdong (CN); Zhuding Zhang, Guangdong (CN); Yang Liu, Guangdong (CN); Min Guo, Guangdong (CN); Shunyu Yao, Guangdong (CN); Xinyan Yi, Guangdong (CN); Xuancong Fang, Guangdong (CN)

(73) Assignee: SOUTH CHINA NORMAL UNIVERSITY, Guangzhou, Guangdong (CN)

( * ) Notice: Subject to any disclaimer, the term of this patent is extended or adjusted under 35 U.S.C. 154(b) by 0 days.

(21) Appl. No.: 15/490,479

(22) Filed: Apr. 18, 2017

(65) Prior Publication Data
US 2018/0138983 A1 May 17, 2018

(30) Foreign Application Priority Data

Nov. 11, 2016 (CN) .......................... 2016 1 0993849

(51) Int. Cl.
*H01L 29/18* (2006.01)
*H01L 33/00* (2010.01)
(Continued)

(52) U.S. Cl.
CPC .......... *H04B 10/502* (2013.01); *H01L 27/15* (2013.01); *H01L 28/10* (2013.01); *H01L 33/06* (2013.01);
(Continued)

(58) Field of Classification Search
None
See application file for complete search history.

(56) References Cited

U.S. PATENT DOCUMENTS

| | | | |
|---|---|---|---|
| 8,629,654 B2 * | 1/2014 | Partovi | H01F 5/003 320/108 |
| 2009/0021181 A1 * | 1/2009 | Brune | B60Q 1/0023 315/291 |

(Continued)

Primary Examiner — Telly Green
(74) Attorney, Agent, or Firm — Muncy, Geissler, Olds & Lowe, P.C.

(57) ABSTRACT

A visible light communication emission device with improved response frequency is provided, comprising a substrate, wherein an inductance coil module is provided on the substrate, a LED chip matrix formed by series connection of a plurality of LED chips is provided on the inductance coil module, and the inductance coil module and the LED chip matrix are connected in series, wherein inductance value L of the inductance coil module is configured to be: $L=1/(\omega^2 C)$, with C representing capacity in the device provided by LED chips and ω representing frequency, wherein the inductance coil module comprises more than one inductance coil whose composition materials from inside to outside are successively Cr, Al, Cr, Ti, and Ag.

9 Claims, 2 Drawing Sheets

(51) Int. Cl.
H04B 10/50 (2013.01)
H04B 10/116 (2013.01)
H05B 33/08 (2006.01)
H01L 27/15 (2006.01)
H01L 49/02 (2006.01)
H01L 33/12 (2010.01)
H01L 33/06 (2010.01)
H01L 33/14 (2010.01)
H01L 33/42 (2010.01)

(52) U.S. Cl.
CPC ............ H01L 33/12 (2013.01); H01L 33/145 (2013.01); H01L 33/42 (2013.01); H04B 10/116 (2013.01); H05B 33/0821 (2013.01)

(56) References Cited

U.S. PATENT DOCUMENTS

| | | | |
|---|---|---|---|
| 2009/0184468 A1* | 7/2009 | Huang | A63F 3/00643 273/237 |
| 2011/0012155 A1* | 1/2011 | Huang | H01L 33/0095 257/98 |

* cited by examiner

VISIBLE LIGHT COMMUNICATION EMISSION DEVICE WITH IMPROVED RESPONSE FREQUENCY

FIELD OF THE INVENTION

The present invention relates to visible light communication and in particular to a visible light communication emission device with improved response frequency.

BACKGROUND OF THE INVENTION

Visible light is a part of electromagnetic spectrum that can be sensed by human eyes. There is not an accurate scope for visible spectrum. In general, the wavelength of electromagnetic wave that can be sensed by human eyes is 400 nm-700 nm. Normal human eyes are most sensitive to electromagnetic wave with the wavelength of about 555 nm, which lies in green band.

Visible light communication technology is a wireless optical communication technology that is developed following the development of light emitting diode (LED) lighting technology. In comparison with traditional wire transmission, visible light communication provides many advantages such as high transmission power, no electromagnetic interference and energy conservation. Therefore it gains widespread attention and research in the world.

LEDs are also being increasingly widely researched and used in various areas. However, it is still hard to create a breakthrough for LEDs in communication technology. Main reasons include the following:

1. Due to the capacity of the LED itself, in case of an input current at a high frequency (>40 MHz), capacitive reactance current created thereby will cause attenuation in the frequency of output signals, which leads to a low response frequency of the device.

2. Patterned substrate has severe absorption to the light.

3. It is hard to obtain a high output power with a single LED chip.

The above aspects lead to low response frequency and low light extraction efficiency of LED that cannot meet the requirement of communication.

SUMMARY OF THE INVENTION

An object of the present invention is to overcome one of the above deficiencies in the art and provide a visible light communication emission device with improved response frequency.

This and other objects and advantages of the present invention are achieved by the solutions described herein after.

A visible light communication emission device with improved response frequency is provided, comprising a substrate, wherein an inductance coil module is provided on the substrate, a LED chip matrix formed by series connection of a plurality of LED chips is provided on the inductance coil module, and the inductance coil module and the LED chip matrix are connected in series, wherein inductance value L of the inductance coil module is configured to be: $L=1/(\omega^2 C)$, with C representing capacity in the device provided by LED chips and $\omega$ representing frequency, wherein the inductance coil module comprises more than one inductance coil whose composition materials from inside to outside are successively Cr, Al, Cr, Ti, and Ag.

In the present invention, LED chips are connected in series to form a LED chip matrix, which provides a high output power and improves lighting capacity, and at the same time provides homogenous lighting and good heat dissipation.

Adding of spiral inductance coils can reduce impedance generated by the capacitive circuit in the LED chip, which can provide capacity compensating and wave filtering, improves response frequency of the device, and protects the circuit.

The inductance coil is made by multilayer materials, with the outmost layer being silver which has an extreme high reflectivity. Light emitted from the positive electrode area of the LED chip is reflected by the silver after reaching the substrate to arrive at the light emitting positive electrode area, which improves light extraction efficiency of the device.

Preferably, the inductance coil is a spiral with a cross section of trapezoid having a lower baseline angle of 45 degree.

The 45 degree trapezoid structure of the inductance coil can make it happen in a better way when the light emitted from the positive electrode area of the LED chip is reflected by the silver after reaching the substrate to arrive at the light emitting positive electrode area, which further improves light extraction efficiency of the device.

Preferably, the inductance coil module comprises four inductance coils which are configured to form a 2×2 matrix, in which each two inductance coils are first connected in series and then connected in parallel with the other two inductance coils.

Preferably, the LED chip comprises successively a buffer layer located on a protective layer of the substrate, an n-type layer to generate electrons, a multiple quantum well layer, a electron blocking layer, a p-type layer, a transparent conductive electrode layer, and a p-type electrode layer.

Preferably, the p-type electrode layer is a polycyclic p-type electrode layer comprising from its outside to inside a nanosilver p-electrode, a ZnO p-electrode, and a Al p-electrode.

Preferably, the Al p-electrode has a thickness of 2-5 nm.

A preparation method for the polycyclic p-type electrode is provided comprising:

(1) evaporate plating a layer of Al by a PECVD device, and forming a cyclic rectangular electrode by chemical etching;

(2) evaporate plating a ZnO film by a MOCVD (Metalorganic Chemical Vapor Deposition) device, and forming a cyclic rectangular ZnO electrode by etching using dry or wet etching;

(3) growing nanosilver as nanosilver particle structure by PECVD evaporate plating or MOCVD technology, so as to provide a nanosilver p-electrode.

The term "nanosilver" is short for silver nanoparticle, which refers to a particle formed by silver atoms with a particle size of 1-100 nm. The p-type electrode of the LED chip is made by conductive materials with high light transmittance in three rings, from outer ring to inner ring respectively being Al, ZnO, and nanosilver. Al has a good electrode conductivity, and the inner ring electrode of Al having a thickness of 2-5 nm also has a light transmittance of 90%. The middle ring electrode of ZnO has a light transmittance of 99%, and a good conductivity. The outer ring electrode of nanosilver particles has a good conductivity and a good light transmittance, which can improve surface light extraction efficiency. The p-type electrode made by conductive materials with high light transmittance in three rings can greatly improve light extraction efficiency of the device.

Preferably, a protective layer of the substrate is provided between the inductance coil module and the LED chip matrix.

Preferably, the protective layer of the substrate is a $Al_2O_3$ protective layer.

After forming a spiral inductance coil on the substrate, a layer of $Al_2O_3$ sapphire material is further evaporate plated, allowing the $Al_2O_3$ material cover middle portions between the spiral inductance coil, which not only increases insulativity between each coil of the spiral inductance coil, protecting the spiral inductance coil, but also patterns the substrate.

Preferably, the substrate is a sapphire substrate.

The present invention provides the following advantages over the prior art:

1. In the present invention, LED chips are connected in series to form a LED chip matrix, which provides a high output power and improves lighting capacity, and at the same time provides homogenous lighting and good heat dissipation.

2. Adding of the spiral inductance coil can reduce the impedance generated in the capacitive circuit in the LED chip, which can provide capacity compensating and wave filtering, and protects the circuit.

3. Al that is evaporate plated in the outmost layer can reflect light that has been transmitted to the surface of the inductance coil to the light emitting area in the front surface. In the meantime, the 45 degree trapezoid structure of the inductance coil can make it happen in a better way when the light transmitted to the surface of the inductance coil is reflected to the light emitting area in the front surface, which further improves light extraction efficiency.

4. The p-type electrode layer of the chip is a polycyclic ring structure comprising from its outside to inside a nanosilver p-electrode, a ZnO p-electrode, and a Al p-electrode, which improves injection efficiency of the carrier and light extraction efficiency.

5. The $Al_2O_3$ protective layer provided between the inductance coil and the chip matrix can protect the inductance coil.

BRIEF DESCRIPTION TO THE DRAWINGS

LIST OF REFERENCE NUMBERS

Figure 1:
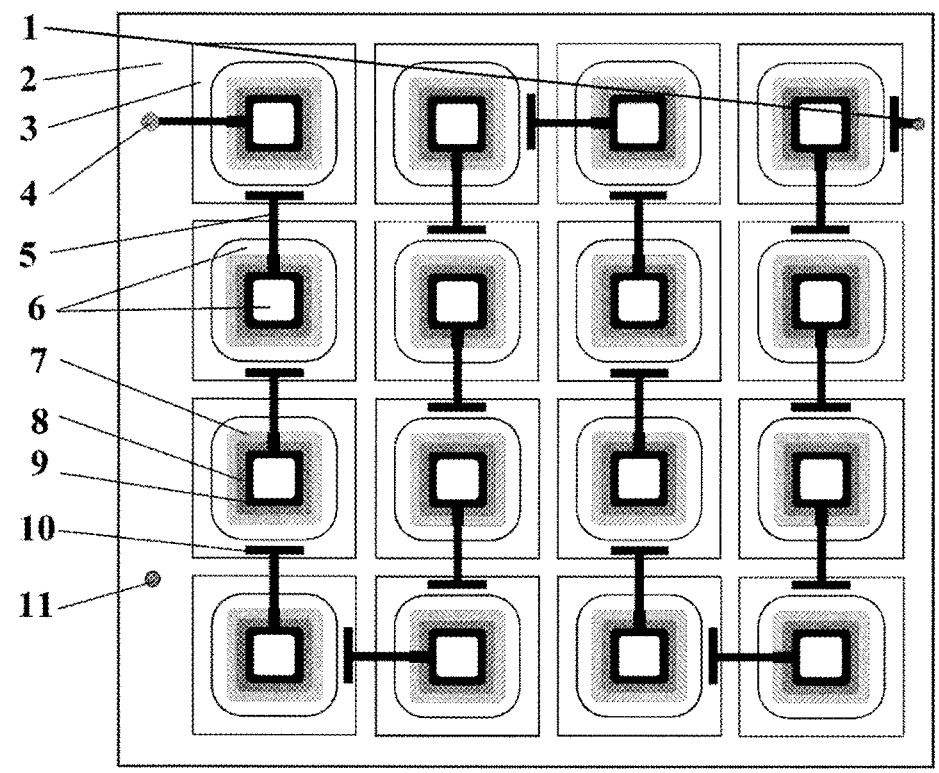
FIG. 1 shows a top view of the visible light communication emission device in an example according to the present invention.

1: hole on the substrate for series connection of the spiral inductance coil with the chips on the front
2: patterned substrate
3: negative electrode area of the chip
4: positive electrode of the device
5: wire between the chips in series connection
6: light emitting positive electrode area of the chip
7: nanosilver p-electrode
8: transparent ZnO p-electrode
9: Al p-electrode
10: n-electrode of the chip
11: negative electrode of the emission device
12: wire connecting inductance coils in parallel
13: wire connecting inductance coils in series
15: spiral inductance coil

DETAILED DESCRIPTION OF THE INVENTION

The present invention will be described in conjugation with embodiments and figures.

FIG. 1 shows a visible light communication emission device with improved response frequency, comprising a substrate. An inductance coil module is provided on the substrate, a LED chip matrix formed by series connection of a plurality of LED chips is provided on the inductance coil module, and the inductance coil module and the LED chip matrix are connected in series. The inductance value L of the inductance coil module is configured to be: $L=1/(\omega^2 C)$, with C representing capacity in the device provided by LED chips and $\omega$ representing frequency. The inductance coil module comprises more than one inductance coil. The composition materials of the inductance coil from inside to outside are successively Cr, Al, Cr, Ti, and Ag.

The inductance coil is made by multilayer materials that have high light transmittance, with the outmost layer being silver which has an extreme high reflectivity. Light emitted by the positive electrode area of the LED chip is reflected by the silver after reaching the substrate to arrive at the light emitting positive electrode area, which improves light extraction efficiency of the device.

As shown in FIG. 1, the present example comprises sixteen LED chips which are connected in series with each other and configured to form a 4×4 matrix.

Since a single chip has a voltage of 3V and a current of 5-30 mA, the device have a total voltage of 8×3V=24V. A single LED chip has a capacitance of about 2000 pF-4000 pF, therefore, in the case that sixteen chips are connected in series in the visible light communication emission device, the device has a total capacitance of about 100 pF-300 pF.

After series connection of the LED chips with the inductance coil module, the circuit has a total impedance of:

$$|Z| = \sqrt{R^2 + \left(\omega L - \frac{1}{\omega C}\right)^2}$$

wherein R represents self-resistance of the device, C represents capacity in the device provided by LED chips, and L represents inductance in the present example used to match the total capacitance of the circuit.

In the case that the spiral inductance is not connected in series in the circuit, when the circuit has a input single of $U_{in}=U_0 \sin(\omega t)$, total current I in the circuit is:

$$I = \frac{U_{in}}{\sqrt{R^2 + \left(0 - \frac{1}{\omega C}\right)^2}} = \frac{U_{in}}{\sqrt{R^2 + \frac{1}{(\omega C)^2}}}$$

The power absorbed by the capacitance is:

$$P_C = I^2 Z_C = \left(\frac{U_{in}}{\sqrt{R^2 + \frac{1}{(\omega C)^2}}}\right)^2 \cdot \left(-\frac{1}{\omega C}\right)$$

It can be obtained that:

$$P_C = -\frac{U_{in}^2}{\omega CR^2 + \frac{1}{\omega C}}$$

When the visible light communication emission device has a total capacitance of 100 pF-300 pF and working frequency of 1 MHz-100 MHz, the ωC has a magnitude of $10^{-4}$-$10^{-2}$. In addition, in operation of the LED, the resistance R is only tens of ohms, thus $P_C$ can be simplified as $P_C = -U_{in}^2 \omega C$. With the frequency ω changing from 1 MHz to 100 MHz, $|P_C|$ also becomes greater, which indicates increasing power absorbed by the capacitance. In other words, output signals suffer from attenuation with increasing of frequency. It is found by practice that, without series connection of a matching inductance, after the frequency reaches 40 MHz, increase of output signals of the visible light communication emission device will suffer from attenuation with increasing of frequency.

In the case that the spiral inductance is connected in series in the circuit, when the circuit also has an input single of $U_{in} = U_0 \sin(\omega t)$, total current in the circuit is:

$$I = \frac{U_{in}}{\sqrt{R^2 + \left(\omega L - \frac{1}{\omega C}\right)^2}}$$

The power absorbed by the capacitance is $P_c = I^2 Z_c$, which can be simplified to be:

$$P_C = -\frac{U_{in}^2}{R^2 + \left(\omega L - \frac{1}{\omega C}\right)^2} \cdot \frac{1}{\omega C}$$

For the same reason, the absorption power of the newly added inductance is:

$$P_L = I^2 Z_L = \frac{U_{in}^2}{R^2 + \left(\omega L - \frac{1}{\omega C}\right)^2} \cdot \omega L$$

In a perfect match of the inductance and the capacitance, $P_C + P_L = 0$. It can be obtained by simplification that $L = 1/(\omega^2 C)$.

Then the total power absorbed by the capacitance and the inductance is $P = P_L + P_C = 0$. In other words, the inductance and the capacitance are perfectly matched, and exchanges energy with each other. The inputted power is totally absorbed by the resistance. At this point, there will be no loss in the circuit at corresponding frequency, which means attenuation of output signal is suppressed. The frequency will increase when the device suffers from attenuation, which improves the response frequency of the LED as a visible light communication emission device.

Preferably, the inductance coil is a spiral. The spiral has a cross section of trapezoid. The trapezoid has a lower baseline angle of 45 degree.

Figure 2:
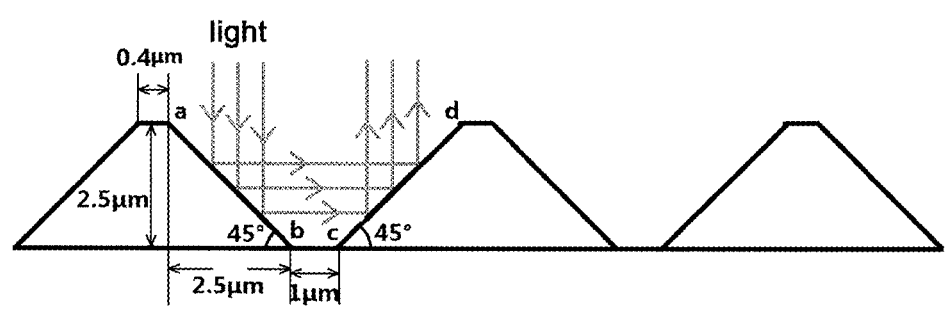
FIG. 2 shows a cross section view of the inductance coil in an example according to the present invention.

As shown in FIG. 2, by the 45 degree trapezoid structure, when the light emitted from the positive electrode area moves downwards, it will arrive at section ab in FIG. 2, after which Al refection layer in the section ab will reflect the light towards section cd, which will then reflect the light in a direction opposite to the incident angle to the light emitting positive electrode area. In this way, the amount of out emitting light in the positive electrode area is increased.

Figure 3:
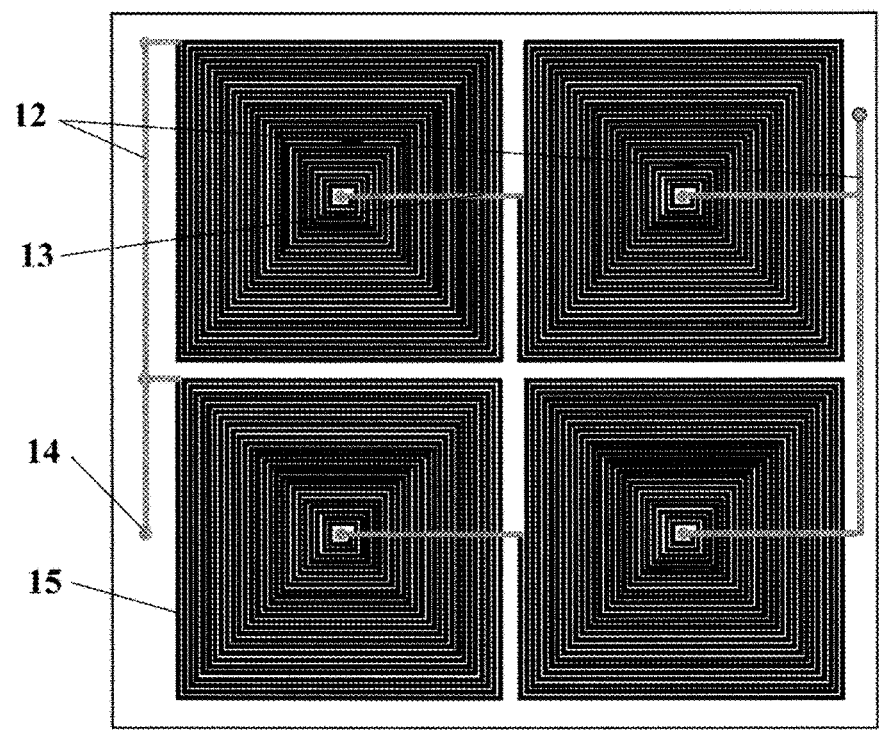
FIG. 3 shows a schematic view of the structure of the inductance coil module in an example according to the present invention.

As shown in FIG. 3, the inductance coil module comprises four inductance coils which are configured to form a 2×2 matrix. Each two inductance coils are first connected in series, and then connected in parallel with the other two inductance coils.

In order to allow the inductance coils arranged under all of the chips, a 2×2 circuit formed by four 320 μm×320 μm inductance coils are used in the present example, with each two inductance coils first connected in series and then connected in parallel with the other two inductance coils.

Since a single LED chip has a capacitance of about 3000 pF, in series connection of sixteen LEDs, the circuit has a total capacitance of about 200 pF. In a match at 40 MHz, the inductance required for the match is 78 nH. In accordance with the Wheeler's equation, the inductance can be determined by:

$$L = \mu_0 N^2 \frac{K_1 d_{avg}}{1 + K_2 \rho}$$

wherein $\mu_0 = 4\pi \times 10^{-7}$ H/m, N represents number of turns in the coil, K is a coefficient related to the arrangement (in a square circle, $K_1 = 2.34$, $K_2 = 2.75$), $d_{avg} = (d_{in} + d_{out})/2$, $\rho = (d_{in} + d_{out})/(d_{out} - d_{in})$ is the inner width of the inductance as a square circle, and $d_{out}$ is the outer width of the inductance as a square circle.

Therefore, in the case of a 2×2 inductance arrangement, the outer width of the inductance is 320 μm while the inner width is 0. In order to obtain an inductance of 78 nH, the number of turns in the coil is required to be 25-26. Since there may be some difference between theoretical calculation and real situation, an inductance of 78 nH with 25 turns per coil is chosen. Since the inductance is made by processes such as exposing, imaging and etching, the width of a metal can only be provided in a limited precision, whose minimal size is generally 0.1 μm. In the present example, the spiral coil has the outer width of 320 μm, the inner width of 0 μm, and the trapezoid has the height of 2.5 μm, the width of the upper baseline of 0.4 μm, the width of the lower baseline of 5.4 μm, and the interval of 1 μm.

Figure 4:
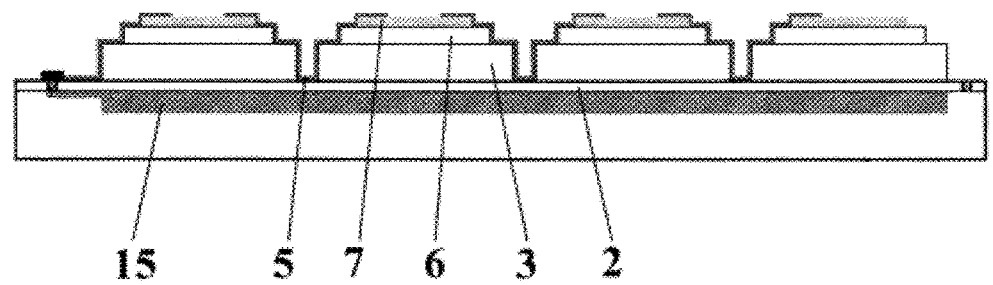
FIG. 4 shows a cross section view of the structure of the visible light communication emission device in an example according to the present invention.

As shown in FIG. 4, the LED chip comprises successively a buffer layer located on a protective layer of the substrate, an n-type layer to generate electrons, a multiple quantum well layer, a electron blocking layer, a p-type layer, a transparent conductive electrode layer, and a p-type electrode layer.

Preferably, the p-type electrode layer is a polycyclic p-type electrode layer comprising from its outside to inside a nanosilver p-electrode, a ZnO p-electrode, and a Al p-electrode.

A preparation method for the polycyclic p-type electrode is provided comprising:

(1) evaporate plating a layer of Al by a PECVD device, and forming a cyclic rectangular electrode by chemical etching;

(2) evaporate plating a ZnO film by a MOCVD (Metalorganic Chemical Vapor Deposition) device, and forming a cyclic rectangular ZnO electrode by etching using dry or wet etching;

(3) growing nanosilver as nanosilver particle structure by PECVD evaporate plating or MOCVD technology, so as to provide a nanosilver p-electrode.

The term "nanosilver" is short for silver nanoparticle, which refers to a particle formed by silver atoms with a particle size of 1-100 nm.

Preferably, a protective layer of the substrate is provided between the inductance coil module and the LED chip matrix.

Preferably, the protective layer of the substrate is a $Al_2O_3$ protective layer.

After forming a spiral inductance coil on the substrate, a layer of $Al_2O_3$ sapphire material is further evaporate plated, allowing the $Al_2O_3$ material cover middle portions between the spiral inductance coil, which not only increases insulativity between each coil of the spiral inductance coil, protecting the spiral inductance coil, but also patterns the substrate.

Preferably, in the present example, the substrate is a sapphire substrate.

The invention claimed is:

1. A visible light communication emission device with improved response frequency, comprising a substrate, wherein an inductance coil module is provided on the substrate, a LED chip matrix formed by series connection of a plurality of LED chips is provided on the inductance coil module, and the inductance coil module and the LED chip matrix are connected in series, wherein inductance value L of the inductance coil module is configured to be: $L=1/(\omega^2 C)$, with C representing capacity in the device provided by LED chips and $\omega$ representing frequency, wherein the inductance coil module comprises more than one inductance coil whose composition materials from inside to outside are successively Cr, Al, Cr, Ti, and Ag.

2. The visible light communication emission device according to claim 1, wherein the inductance coil is a spiral with a cross section of trapezoid having a lower baseline angle of 45 degree.

3. The visible light communication emission device according to claim 1, wherein the inductance coil module comprises four inductance coils which are configured to form a 2×2 matrix, in which each two inductance coils are first connected in series and then connected in parallel with the other two inductance coils.

4. The visible light communication emission device according to claim 1, wherein the LED chip comprises successively a buffer layer located on a protective layer of the substrate, an n-type layer to generate electrons, a multiple quantum well layer, a electron blocking layer, a p-type layer, a transparent conductive electrode layer, and a p-type electrode layer.

5. The visible light communication emission device according to claim 4, wherein the p-type electrode layer is a polycyclic p-type electrode layer comprising from its outside to inside a nanosilver p-electrode, a ZnO p-electrode, and a Al p-electrode.

6. The visible light communication emission device according to claim 5, wherein the Al p-electrode has a thickness of 2-5 nm.

7. The visible light communication emission device according to claim 1, wherein a protective layer of the substrate is provided between the inductance coil module and the LED chip matrix.

8. The visible light communication emission device according to claim 7, wherein the protective layer of the substrate is a $Al_2O_3$ protective layer.

9. The visible light communication emission device according to claim 1, wherein the substrate is a sapphire substrate.

* * * * *